US008847074B2

(12) United States Patent
Mann et al.

(10) Patent No.: US 8,847,074 B2
(45) Date of Patent: Sep. 30, 2014

(54) CARBON NANOTUBE-BASED COAXIAL ELECTRICAL CABLES AND WIRING HARNESS

(75) Inventors: Jennifer Mann, Chichester, NH (US); David S. Lashmore, Lebanon, NH (US); Brian White, Manchester, NH (US); Peter L. Antoinette, Nashua, NH (US)

(73) Assignee: Nanocomp Technologies, Merrimack, NH (US)

( * ) Notice: Subject to any disclaimer, the term of this patent is extended or adjusted under 35 U.S.C. 154(b) by 0 days.

(21) Appl. No.: 12/437,537

(22) Filed: May 7, 2009

(65) Prior Publication Data

US 2010/0000754 A1    Jan. 7, 2010

Related U.S. Application Data

(60) Provisional application No. 61/051,249, filed on May 7, 2008.

(51) Int. Cl.
   *H01B 7/36*         (2006.01)
   *H01B 1/04*         (2006.01)
   *H01B 13/016*      (2006.01)

(52) U.S. Cl.
   CPC .............. *H01B 1/04* (2013.01); *H01B 13/0162* (2013.01)
   USPC ................................. 174/102 SC; 174/106 R (58) Field of Classification Search
   USPC ............................. 174/102 R, 102 SC, 106 R
   See application file for complete search history.

(56) References Cited

U.S. PATENT DOCUMENTS

| 3,090,876 A | 5/1963 | Hutson |
| 3,109,712 A | 11/1963 | Redfern |
| 3,706,193 A | 12/1972 | Amato |
| 3,943,689 A | 3/1976 | Kunz et al. |
| 4,384,944 A | 5/1983 | Silver et al. ............... 204/159.13 |
| 4,468,922 A | 9/1984 | McCrady et al. |
| 4,987,274 A | 1/1991 | Miller et al. .................. 174/102 |
| 5,428,884 A | 7/1995 | Tsuzuki |
| 5,747,161 A | 5/1998 | Iijima |

(Continued)

FOREIGN PATENT DOCUMENTS

| CN | 1614772 | 5/2005 |
| EP | 1160861 A2 | 12/2001 |

(Continued)

OTHER PUBLICATIONS

Gou, J.G., "*Passage: Nanotube Bucky Papers and Nanocomposites*", Ph.D. Dissertation, Marburg An Der Lahn, pp. 93-126, Jan. 1, 2002.

(Continued)

*Primary Examiner* — Chau N Nguyen
(74) *Attorney, Agent, or Firm* — Greenberg Traurig, LLP; Chinh H. Pham; Todd C. Basile (57) ABSTRACT

A cable having a conducting member made from a nanostructure-based material, and a shielding layer made of nanostructure-based material. The shielding layer can be circumferentially situated about the conducting member so as to enhance conductivity along the conducting member. A coupling mechanism may be situated between the shielding layer and the conducting member so as to secure the shielding layer in its position on the conducting member. A method of making the cable is also disclosed.

7 Claims, 11 Drawing Sheets

(56) References Cited

U.S. PATENT DOCUMENTS

| | | | |
|---|---|---|---|
| 6,043,468 A | 3/2000 | Toya et al. | |
| 6,110,590 A | 8/2000 | Zarkoob et al. | |
| 6,143,412 A * | 11/2000 | Schueller et al. | 428/408 |
| 6,265,466 B1 | 7/2001 | Glatkowski et al. | 523/137 |
| 6,299,812 B1 | 10/2001 | Newman et al. | |
| 6,308,509 B1 | 10/2001 | Scardino et al. | |
| 6,333,016 B1 | 12/2001 | Resasco et al. | |
| 6,376,971 B1 | 4/2002 | Pelrine et al. | |
| 6,426,134 B1 | 7/2002 | Lavin et al. | |
| 6,452,085 B2 | 9/2002 | Tauchi et al. | |
| 6,495,116 B1 | 12/2002 | Herman | |
| 6,541,744 B2 | 4/2003 | Von Arx et al. | |
| 6,611,039 B2 | 8/2003 | Anthony et al. | |
| 6,682,677 B2 | 1/2004 | Lobovsky et al. | |
| 6,706,402 B2 | 3/2004 | Rueckes et al. | |
| 6,713,034 B2 | 3/2004 | Nakamura et al. | |
| 6,723,299 B1 | 4/2004 | Chen et al. | |
| 6,784,656 B2 | 8/2004 | Breinlinger | |
| 6,790,426 B1 | 9/2004 | Ohsaki | |
| 6,842,328 B2 | 1/2005 | Schott et al. | |
| 6,908,572 B1 | 6/2005 | Derbyshire et al. | |
| 6,923,946 B2 | 8/2005 | Geohegan et al. | |
| 6,979,709 B2 | 12/2005 | Smalley et al. | |
| 7,001,556 B1 | 2/2006 | Shambaugh | |
| 7,045,108 B2 | 5/2006 | Jiang et al. | |
| 7,048,999 B2 | 5/2006 | Smalley et al. | 428/367 |
| 7,052,668 B2 | 5/2006 | Smalley et al. | |
| 7,182,929 B1 | 2/2007 | Singhal et al. | |
| 7,323,157 B2 | 1/2008 | Kinloch et al. | |
| 7,413,474 B2 | 8/2008 | Liu et al. | |
| 7,437,938 B2 | 10/2008 | Chakraborty | |
| 7,491,883 B2 * | 2/2009 | Lee et al. | 174/28 |
| 7,553,472 B2 | 6/2009 | Mouli et al. | |
| 7,615,097 B2 | 11/2009 | McKechnie et al. | |
| 7,615,204 B2 | 11/2009 | Ajayan et al. | |
| 7,704,480 B2 | 4/2010 | Jiang et al. | |
| 7,727,504 B2 | 6/2010 | Kittrell et al. | |
| 7,745,810 B2 | 6/2010 | Rueckes et al. | |
| 7,750,240 B2 * | 7/2010 | Jiang et al. | 174/102 R |
| 7,846,414 B2 | 12/2010 | Harbec et al. | |
| 7,897,248 B2 | 3/2011 | Barrera et al. | |
| 7,906,208 B2 | 3/2011 | Poulin et al. | |
| 7,938,996 B2 | 5/2011 | Baughman et al. | |
| 8,017,272 B2 | 9/2011 | Feng et al. | |
| 8,053,113 B2 | 11/2011 | Oh et al. | |
| 8,071,906 B2 | 12/2011 | Smiljanic et al. | |
| 2001/0003576 A1 | 6/2001 | Klett et al. | |
| 2002/0004028 A1 | 1/2002 | Margrave et al. | |
| 2002/0040900 A1 | 4/2002 | Arx et al. | |
| 2002/0113335 A1 | 8/2002 | Lobovsky et al. | |
| 2002/0130610 A1 | 9/2002 | Gimzewski et al. | |
| 2002/0136681 A1 | 9/2002 | Smalley et al. | |
| 2002/0179564 A1 | 12/2002 | Geobegan et al. | |
| 2003/0012111 A1 | 1/2003 | Lee | |
| 2003/0133865 A1 | 7/2003 | Smalley et al. | |
| 2003/0134916 A1 * | 7/2003 | Hrubesh | 521/50 |
| 2003/0165648 A1 | 9/2003 | Lobovsky et al. | |
| 2004/0020681 A1 * | 2/2004 | Hjortstam et al. | 174/102 SC |
| 2004/0053780 A1 | 3/2004 | Jiang et al. | |
| 2004/0081758 A1 | 4/2004 | Mauthner | |
| 2004/0124772 A1 | 7/2004 | Chen | |
| 2004/0150312 A1 | 8/2004 | McElrath et al. | |
| 2004/0173906 A1 | 9/2004 | Saito et al. | |
| 2004/0177451 A1 | 9/2004 | Poulin et al. | |
| 2004/0240144 A1 | 12/2004 | Schott et al. | |
| 2004/0265212 A1 | 12/2004 | Varadan et al. | |
| 2004/0265489 A1 | 12/2004 | Dubin | |
| 2004/0266065 A1 | 12/2004 | Zhang et al. | |
| 2005/0006801 A1 | 1/2005 | Kinloch et al. | |
| 2005/0046017 A1 | 3/2005 | Dangelo | |
| 2005/0063658 A1 | 3/2005 | Crowley | |
| 2005/0067406 A1 | 3/2005 | Rjarajan et al. | |
| 2005/0087222 A1 | 4/2005 | Muller-Werth | |
| 2005/0104258 A1 | 5/2005 | Lennhoff | |
| 2005/0112051 A1 | 5/2005 | Liu et al. | |
| 2005/0170089 A1 | 8/2005 | Lashmore et al. | |
| 2005/0179594 A1 | 8/2005 | Morikawa et al. | |
| 2005/0269726 A1 | 12/2005 | Matabayas, Jr. | |
| 2006/0118158 A1 | 6/2006 | Zhang et al. | |
| 2006/0252853 A1 | 11/2006 | Ajayan et al. | |
| 2006/0272701 A1 | 12/2006 | Ajayan et al. | |
| 2007/0009421 A1 | 1/2007 | Kittrell et al. | |
| 2007/0029291 A1 | 2/2007 | Boulos et al. | |
| 2007/0036709 A1 | 2/2007 | Lashmore et al. | 423/447.1 |
| 2007/0048211 A1 | 3/2007 | Jiang et al. | |
| 2007/0056855 A1 | 3/2007 | Lo et al. | |
| 2007/0087121 A1 | 4/2007 | Chang et al. | |
| 2007/0092431 A1 | 4/2007 | Resasco et al. | |
| 2007/0116627 A1 | 5/2007 | Collier et al. | |
| 2007/0116631 A1 | 5/2007 | Li et al. | |
| 2007/0140947 A1 | 6/2007 | Schneider et al. | |
| 2007/0151744 A1 | 7/2007 | Chen | 174/110 |
| 2007/0166223 A1 | 7/2007 | Jiang et al. | |
| 2007/0232699 A1 | 10/2007 | Russell et al. | |
| 2007/0236325 A1 | 10/2007 | Bertin et al. | |
| 2007/0277866 A1 | 12/2007 | Sander et al. | |
| 2007/0293086 A1 * | 12/2007 | Liu et al. | 439/578 |
| 2008/0170982 A1 | 7/2008 | Zhang et al. | |
| 2008/0238882 A1 | 10/2008 | Sivarajan et al. | |
| 2009/0042455 A1 | 2/2009 | Mann et al. | |
| 2009/0044848 A1 | 2/2009 | Lashmore et al. | |
| 2009/0047513 A1 | 2/2009 | Lashmore | |
| 2009/0075545 A1 | 3/2009 | Lashmore et al. | |
| 2009/0117025 A1 | 5/2009 | Lashmore et al. | |
| 2009/0169819 A1 | 7/2009 | Drzaic et al. | |
| 2009/0194525 A1 | 8/2009 | Lee et al. | |
| 2009/0255706 A1 | 10/2009 | Jiang et al. | |
| 2009/0269511 A1 | 10/2009 | Zhamu et al. | |
| 2009/0277897 A1 | 11/2009 | Lashmore et al. | |
| 2009/0311166 A1 | 12/2009 | Hart et al. | |
| 2010/0041297 A1 | 2/2010 | Jiang et al. | |
| 2010/0219383 A1 | 9/2010 | Eklund | |
| 2010/0220074 A1 | 9/2010 | Irvin, Jr. et al. | |
| 2010/0243295 A1 | 9/2010 | Allemand et al. | |
| 2010/0270058 A1 | 10/2010 | Mahoney et al. | |
| 2010/0271253 A1 | 10/2010 | Shah et al. | |
| 2010/0328845 A1 | 12/2010 | Hiralal et al. | |
| 2011/0005808 A1 | 1/2011 | White et al. | |
| 2011/0007477 A1 | 1/2011 | Xu et al. | |
| 2012/0045385 A1 | 2/2012 | Lashmore et al. | |
| 2012/0118552 A1 | 5/2012 | White et al. | |

FOREIGN PATENT DOCUMENTS

| | | |
|---|---|---|
| EP | 2365117 | 9/2011 |
| JP | 1958-072036 | 5/1983 |
| JP | 8 035069 | 2/1996 |
| JP | H09509779 | 9/1997 |
| JP | 2000-058228 | 2/2000 |
| JP | 2003518330 | 6/2003 |
| JP | 2004253796 | 9/2004 |
| JP | 2004-315297 | 11/2004 |
| JP | 2005-075672 | 3/2005 |
| JP | 2005/281672 | 10/2005 |
| JP | 2006-335604 | 12/2006 |
| JP | 2002-515847 | 5/2008 |
| JP | 2008523254 | 7/2008 |
| JP | 2011-508364 | 3/2011 |
| KR | 2005-0007886 | 1/2005 |
| WO | WO 98/39250 | 9/1998 |
| WO | WO 02/055769 | 7/2002 |
| WO | WO 03/080905 | 10/2003 |
| WO | WO 2006/052039 | 5/2006 |
| WO | WO 2006/069007 | 6/2006 |
| WO | WO 2006/073460 | 7/2006 |
| WO | WO 2007/003879 | 1/2007 |
| WO | WO 2007/015710 | 2/2007 |
| WO | WO 2007/089118 | 8/2007 |
| WO | WO2008/002071 | 1/2008 |
| WO | WO 2008/036068 | 3/2008 |

(56) References Cited

FOREIGN PATENT DOCUMENTS

| WO | WO 2008/048286 | 4/2008 |
|----|----------------|--------|
| WO | WO 2006/099156 | 9/2009 |
| WO | WO2009155267 | 12/2009 |

OTHER PUBLICATIONS

Hanson, G.W., "Fundamental Transmitting Properties of Carbon Nanotube Antennas", IEEE Transactions on Antennas and Propagation, vol. 53, No. 11, pp. 3426-3435, Nov. 2005.
Lee et al., "*Synthesis of Carbon Nanotubes Over Gold Nanoparticle Supported Catalysts*", Carbon, vol. 43, pp. 2654-2663, May 13, 2005.
Merriam Webster Dictionary definition of "along", available at http://merriam-webster.com/dictionary/along (retrieved Sep. 16, 2010).
"Metallurgical & Chemical Engineering", McGraw Publishing Co., vol. 15, No. 5, pp. 258-259, Dec. 15, 1916.
Schaevitz et al., "*A Combustion-Based Mems Thermoelectric Power Generator*", The 11$^{th}$ Conference on Solid-State Sensors and Actuators, Munich, Germany, Jun. 10-14, 2001.
Xiao et al., "*High-Mobility Thin-Film Transistors Based on Aligned Carbon Nanotubes*", Applied Physics Letters, vol. 83, No. 1, pp. 150-152, Jul. 7, 2003.
Office Action cited in U.S. Appl. No. 11/413,512 mailed Jul. 8, 2010.
Office Action cited in U.S. Appl. No. 11/415,927 mailed Feb. 22, 2010.
Office Action cited in U.S. Appl. No. 11/415,927 mailed Sep. 9, 2010.
Office Action cited in U.S. Appl. No. 11/715,756 mailed Jan. 25, 2010.
Office Action cited in U.S. Appl. No. 11/818,279 mailed Jun. 2, 2010.
Office Action cited in U.S. Appl. No. 12/187,278 mailed Jun. 11, 2010.
Office Action cited in U.S. Appl. No. 12/191,765 mailed May 14, 2010.
Office Action cited in U.S. Appl. No. 12/390,906 mailed Jul. 9, 2010.
International Search Report based on PCT/US2009/043209 dated Mar. 3, 2010.
International Search Report based on PCT/US2010/041374 dated Sep. 8, 2010.
European Search Report based on EP 06849762.7 dated Jan. 14, 2010.
Australian Examiner's Report cited in AU Serial No. 2006249601 dated Jun. 24, 2010.
Australian Examiner's Report cited in AU Serial No. 2006350110 dated Feb. 9, 2010.
Okabe et al. *New Porous Carbon Materials, Woodceramics*: Development and Fundamental Properties, Journal of Porous Materials. 2, 1996, abstract.
Biro, et al., "Direct Synthesis of Multi-Walled and Single-Walled Carbon Nanotubes by Spray-Pyrolysis", J. Optoelectronics and Advanced Materials, Sep. 2003; vol. 5, No. 3, pp. 661-666.
Kaili, et al., "Spinning Continuous Carbon Nanotube Yarns", Nature, Oct. 24, 2002, vol. 419, p. 801.
Li, et al., "Direct Spinning of Carbon Nanotube Fibers from Chemical Vapor Deposition Synthesis", Apr. 9, 2004, vol. 304, pp. 276-278.
Tapaszto, et al., "Diameter and Morphology Dependence on Experimental Conditions of Carbon Nanotube Arrays Grown by Spray Pyrolysis", Carbon, Jan. 2005; vol. 43, pp. 970-977.
Non-Final Office Action in U.S. Appl. No. 12/140,263 mailed Sep. 20, 2010.
Non-Final Office Action in U.S. Appl. No. 12/187,278 mailed Sep. 29, 2010.
Non-Final Office Action in U.S. Appl. No. 12/038,408 mailed Oct. 14, 2010.
Non-Final Office Action in U.S. Appl. No. 12/437,537 mailed Oct. 25, 2010.
Final Office Action in U.S. Appl. No. 12/191,765 mailed Oct. 28, 2010.
Supplementary European Search Report based on EP 06851553.5 dated Nov. 15, 2010.
Moisala et al., "Single-walled carbon nanotube synthesis using ferrocene and iron pentacarbonyl in a laminar flow reactor," *Chemical Engineering Science*, 61(13), pp. 4393-4402 (Jul. 2006).
Official Action cited in JP Serial No. 2008-540155 dated Mar. 8, 2011.
Final Office Action in U.S. Appl. No. 12/140,263 mailed Mar. 9, 2011.
Non-Final Office Action in U.S. Appl. No. 11/415,927 mailed Mar. 10, 2011.
Non-Final Office Action in U.S. Appl. No. 12/180,300 mailed Mar. 16, 2011.
Non-Final Office Action in U.S. Appl. No. 12/191,765 mailed Apr. 4, 2011.
Non-Final Office Action in U.S. Appl. No. 12/566,229 mailed Apr. 6, 2011.
Gou, "Single-Walled Carbon Nanotube Bucky Paper/Epoxy Composites: Molecular Dynamics Simulation and Process Development," Ph.D. Dissertation, The Florida State University, pp. 1-176 (Fall 2002).
Supplementary European Search Report based on EP 08797307 dated Mar. 29, 2011.
Supplementary European Search Report based on EP 06851749 dated Apr. 1, 2011.
Supplementary European Search Report based on EP 09743708 dated Apr. 19, 2011.
Non-Final Office Action in U.S. Appl. No. 12/841,768 mailed May 26, 2011.
Zhu et al., "Direct synthesis of long single-walled carbon nanotube strands," *Science*, 296(5569), pp. 884,886 (May 3, 2002).
Non-Final Office Action in U.S. Appl. No. 12/170,092 mailed Nov. 21, 2011.
European Search Report based on EP 11168621.8 dated Jul. 8, 2011.
Pipes et al., "Helical carbon nanotube arrays: mechanical properties," Composites Science and Technology. 62: 419-428 (2002).
Canadian Search Report for Canadian Patent Application No. 2,609,712 mailed Jul. 30, 2012.
European Search Report for European Patent Application No. 10160098.9 mailed Mar. 9, 2012.
European Search Report for European Patent Application No. 08726128.5 mailed Aug. 10, 2012.
International Search Report for International Patent Application No. PCT/US12/20194 mailed May 1, 2012.
International Search Report for International Patent Application No. PCT/US12/33300 mailed Jul. 5, 2012.
Japanese Office Action issued for Japanese Patent Application No. 2009-551705 mailed on May 29, 2012.
Office Action issued for Australian Patent Application No. 2008311234 mailed on Feb. 14, 2012.
Office Action issued for U.S. Appl. No. 12/038,408 mailed on Feb. 23, 2012.
Office Action issued for U.S. Appl. No. 12/580,994 mailed on Mar. 12, 2012.
Office Action issued for U.S. Appl. No. 12/437,538 mailed on Mar. 26, 2012.
Office Action issued for U.S. Appl. No. 12/566,229 mailed on May 4, 2012.
Office Action issued for U.S. Appl. No. 12/437,535 mailed on Aug. 22, 2012.
European Search Report for European Patent Application No. 13160030 mailed Apr. 19, 2013.
International Search Report for International Patent Application No. PCT/US12/48665 mailed Nov. 20, 2012.
Office Action issued for U.S. Appl. No. 12/437,535 mailed on Dec. 5, 2012.
Office Action issued for U.S. Appl. No. 12/841,768 mailed on Mar. 13, 2013.
Office Action issued for Canadian Patent Application No. 2,627,997 mailed on Apr. 25, 2013.
European Search Report in European Application No. EP09743711 mailed on Oct. 8, 2013.
International Search Report in International Application No. PCT/US2013/022873 mailed Sep. 27, 2013.

* cited by examiner

CARBON NANOTUBE-BASED COAXIAL ELECTRICAL CABLES AND WIRING HARNESS

RELATED U.S. APPLICATION(S)

The present application claims priority to U.S. Provisional Patent Application Ser. No. 61/051,249, filed May 7, 2008 which application is hereby incorporated by reference in its entirety.

GOVERNMENT SUPPORT

The invention was supported, in whole or in part, by Contract No. FA 8650-08-M-2823 from the Air Force. The Government may have certain rights in the invention.

TECHNICAL FIELD

The present invention relates to the formation of a cable, and more particularly, to a conducting member made from a nanostructure-based material and a shielding layer made from a material capable of providing substantially low resistance coupling.

BACKGROUND ART

Carbon nanotubes are known to have extraordinary tensile strength, including high strain to failure and relatively high tensile modulus. Carbon nanotubes may also be highly resistant to fatigue, radiation damage, and heat. To this end, the addition of carbon nanotubes to composite materials can increase tensile strength and stiffness of the composite materials.

Within the last fifteen (15) years, as the properties of carbon nanotubes have been better understood, interests in carbon nanotubes have greatly increased within and outside of the research community. One key to making use of these properties is the synthesis of nanotubes in sufficient quantities for them to be broadly deployed. For example, large quantities of carbon nanotubes may be needed if they are to be used as high strength components of composites in macroscale structures (i.e., structures having dimensions greater than 1 cm.)

One common route to nanotube synthesis can be through the use of gas phase pyrolysis, such as that employed in connection with chemical vapor deposition. In this process, a nanotube may be formed from the surface of a catalytic nanoparticle. Specifically, the catalytic nanoparticle may be exposed to a gas mixture containing carbon compounds serving as feedstock for the generation of a nanotube from the surface of the nanoparticle.

Recently, one promising route to high-volume nanotube production has been to employ a chemical vapor deposition system that grows nanotubes from catalyst particles that "float" in the reaction gas. Such a system typically runs a mixture of reaction gases through a heated chamber within which the nanotubes may be generated from nanoparticles that have precipitated from the reaction gas. Numerous other variations may be possible, including ones where the catalyst particles may be pre-supplied.

In cases where large volumes of carbon nanotubes may be generated, however, the nanotubes may attach to the walls of a reaction chamber, resulting in the blockage of nanomaterials from exiting the chamber. Furthermore, these blockages may induce a pressure buildup in the reaction chamber, which can result in the modification of the overall reaction kinetics. A modification of the kinetics can lead to a reduction in the uniformity of the material produced.

An additional concern with nanomaterials may be that they need to be handled and processed without generating large quantities of airborne particulates, since the hazards associated with nanoscale materials are not yet well understood.

The processing of nanotubes or nanoscale materials for macroscale applications has steadily increased in recent years. The use of nanoscale materials in textile fibers and related materials has also been increasing. In the textile art, fibers that are of fixed length and that have been processed in a large mass may be referred to as staple fibers. Technology for handling staple fibers, such as flax, wool, and cotton has long been established. To make use of staple fibers in fabrics or other structural elements, the staple fibers may first be formed into bulk structures such as yarns, tows, or sheets, which then can be processed into the appropriate materials.

Accordingly, it would be desirable to provide a material that can take advantage of the characteristics and properties of carbon nanotubes, so that a cable made of carbon nanotubes can be processed for end use applications.

SUMMARY OF THE INVENTION

The present invention provides, in accordance with one embodiment, a cable. In an embodiment, the cable may include a conducting member made from a nanostructure-based material, a shielding layer made of nanostructure-based material and circumferentially situated about the conducting member so as to enhance conductivity along the conducting member, and a coupling mechanism situated between the shielding layer and the conducting member so as to secure the shielding layer in its position on the conducting member.

The present invention provides, in accordance with another embodiment, a method for making a cable. The method may include providing a conducting member made from a nanostructure-based material, placing a shielding layer circumferentially about the conducting member, and applying a coupling mechanism between the shielding layer and the conducting member so as to secure the shielding layer in its position about the conducting member.

DESCRIPTION OF SPECIFIC EMBODIMENTS

Figure 1:
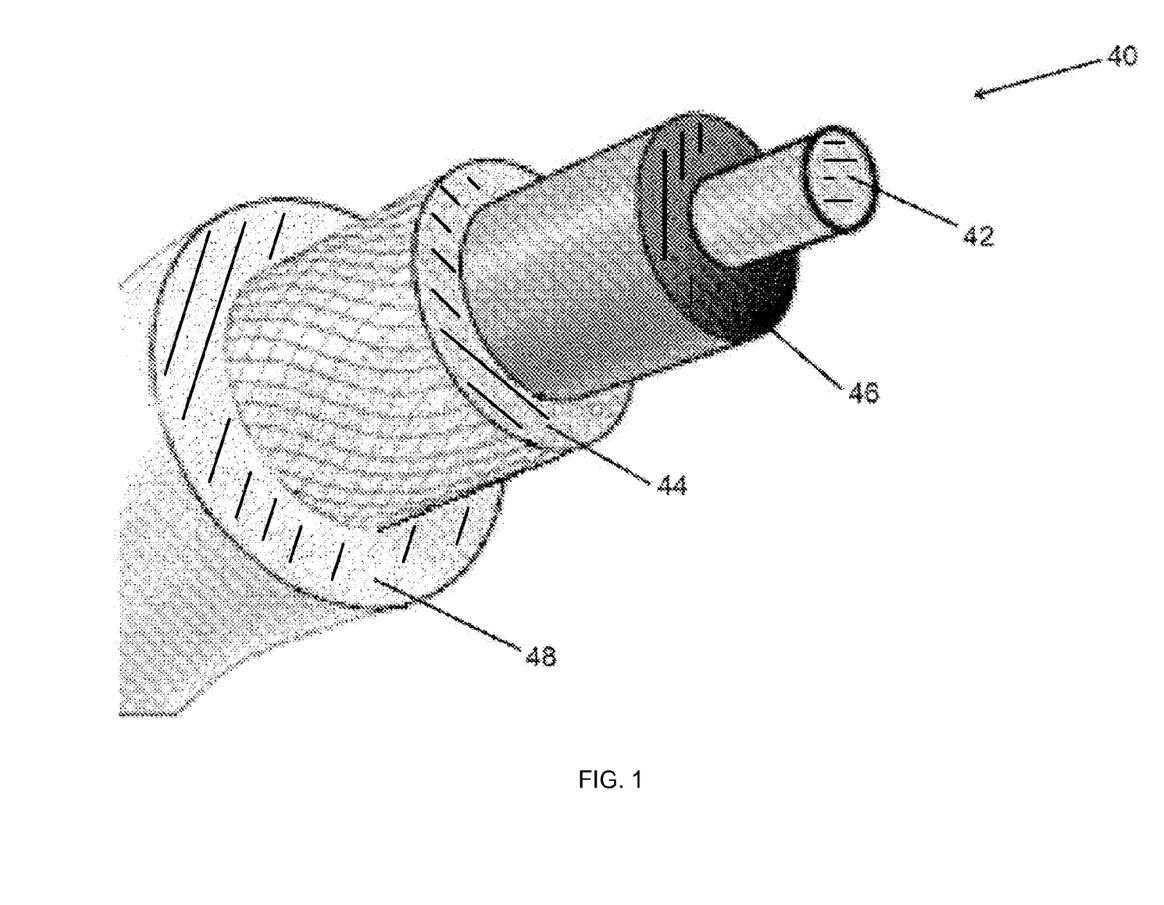
FIG. 1 illustrates a cable in accordance with one embodiment of the present invention.

The present invention provides, in accordance with one embodiment, a cable. In an embodiment, the cable, as shown in FIG. 1, may include a conducting member 42 made from a nanostructure-based material. The cable may also include a shielding layer positioned about the conducting member 42. The cable may further include an insulation layer to improve conductivity and reduce resistivity of the cable. The cable may further include a coupling mechanism situated between the conducting member 42 and the shielding layer. The coupling mechanism may act to secure the shielding layer on the cable. The coupling mechanism further acts to maintain transmission of current along the conducting member 42.

Presently, there exist multiple processes and variations thereof for growing nanotubes, and forming sheets or cable structures made from these nanotubes. These include: (1) Chemical Vapor Deposition (CVD), a common process that can occur at near ambient or at high pressures, and at temperatures above about 400° C., (2) Arc Discharge, a high temperature process that can give rise to tubes having a high degree of perfection, and (3) Laser ablation.

The present invention, in one embodiment, employs a CVD process or similar gas phase pyrolysis procedures known in the industry to generate the appropriate nanostructures, including carbon nanotubes. Growth temperatures for a CVD process can be comparatively low ranging, for instance, from about 400° C. to about 1350° C. Carbon nanotubes, both single wall (SWNT) or multiwall (MWNT), may be grown, in an embodiment of the present invention, by exposing nanoscaled catalyst particles in the presence of reagent carbon-containing gases (i.e., gaseous carbon source). In particular, the nanoscaled catalyst particles may be introduced into the reagent carbon-containing gases, either by addition of existing particles or by in situ synthesis of the particles from a metal-organic precursor, or even non-metallic catalysts. Although both SWNT and MWNT may be grown, in certain instances, SWNT may be selected due to their relatively higher growth rate and tendency to form rope-like structures, which may offer advantages in handling, thermal conductivity, electronic properties, and strength.

The strength of the individual carbon nanotubes generated in connection with the present invention may be about 30 GPa or more. Strength, as should be noted, is sensitive to defects. However, the elastic modulus of the carbon nanotubes fabricated in the present invention may not be sensitive to defects and can vary from about 1 to about 1.2 TPa. Moreover, the strain to failure of these nanotubes, which generally can be a structure sensitive parameter, may range from a about 10% to a maximum of about 25% in the present invention.

Furthermore, the nanotubes of the present invention can be provided with relatively small diameter. In an embodiment of the present invention, the nanotubes fabricated in the present invention can be provided with a diameter in a range of from less than 1 nm to about 10 nm.

The nanotubes of the present invention can also be used as a conducting member to carry relatively high current similar to a Litz wire or cable. However, unlike a Litz wire or cable soldered to a connector portion, the nanotube conducting member of the present invention can exhibit relatively lower impedance in comparison. In particular, it has been observed in the present invention that the shorter the current pulses, the better the nanotube-based wire cable or ribbon would perform when compared with a copper ribbon or Litz wire. One reason for the observed better performance may be that the effective frequency content of the pulse, which can be calculated from the Fourier Transform of the waveform for current pulses that are square and short, e.g., about 100 ms to less than about 1 ms, can be very high. Specifically, individual carbon nanotubes of the present invention can serve as conducting pathways, and due to their small size, when bulk structures are made from these nanotubes, the bulk structures can contain extraordinarily large number of conducting elements, for instance, on the order of $10^{14}/cm^2$ or greater.

Carbon nanotubes of the present invention can also demonstrate ballistic conduction as a fundamental means of conductivity. Thus, materials made from nanotubes of the present invention can represent a significant advance over copper and other metallic conducting members under AC current conditions. However, joining this type of conducting member to an external circuit requires that essentially each nanotube be electrically or thermally contacted to avoid contact resistance at the junction.

Figure 2:
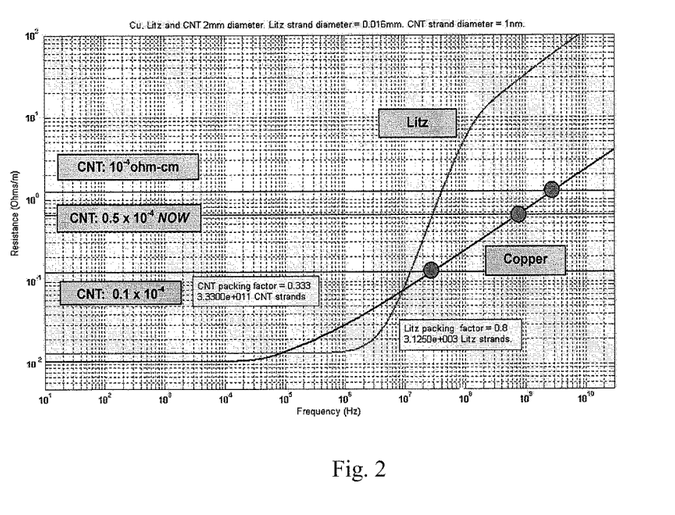
FIG. 2 illustrates the break even frequencies for conducting members made in accordance with one embodiment of the present invention.
Figure 3:
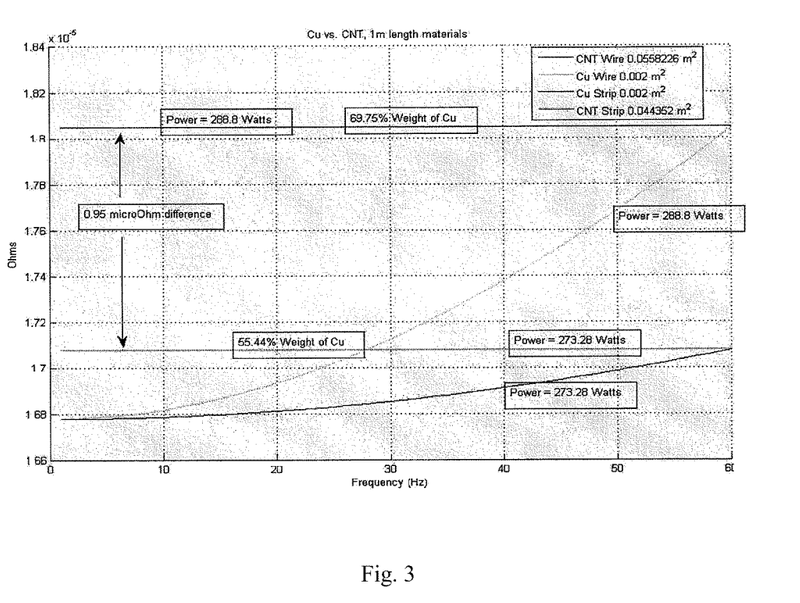
FIG. 3 illustrates the break even frequencies for conducting members made in accordance with another embodiment of the present invention.
Figure 4:
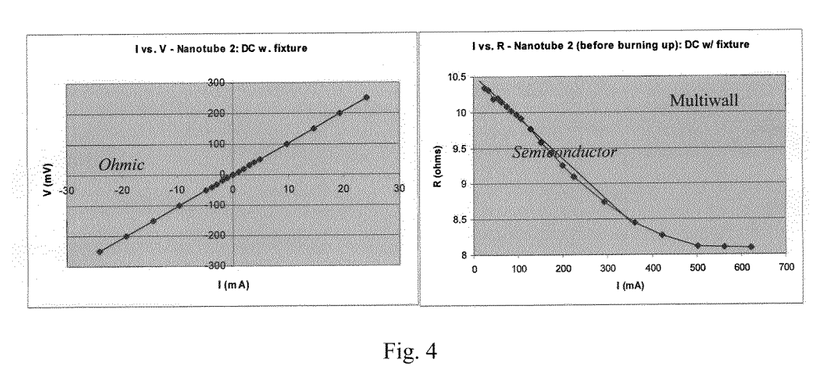
FIG. 4 illustrates electrical properties of carbon nanotubes made in accordance with one embodiment of the present invention.
Figure 5:
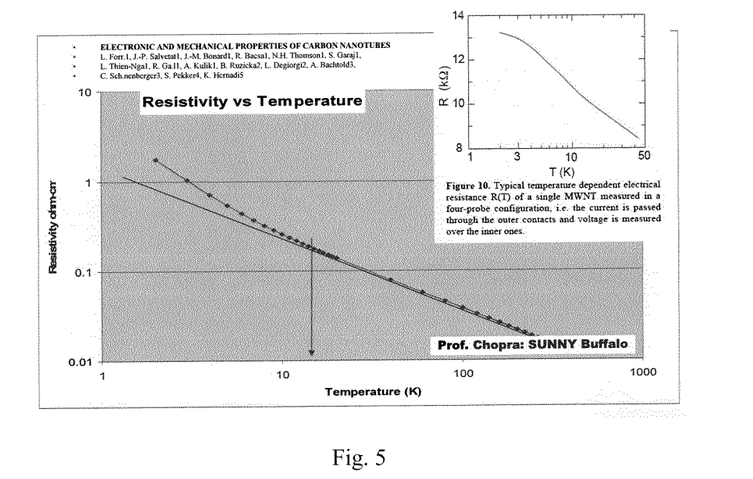
FIG. 5 illustrates resistivity versus temperature characteristics of carbon nanotubes made in accordance with one embodiment of the present invention.
Figure 6:
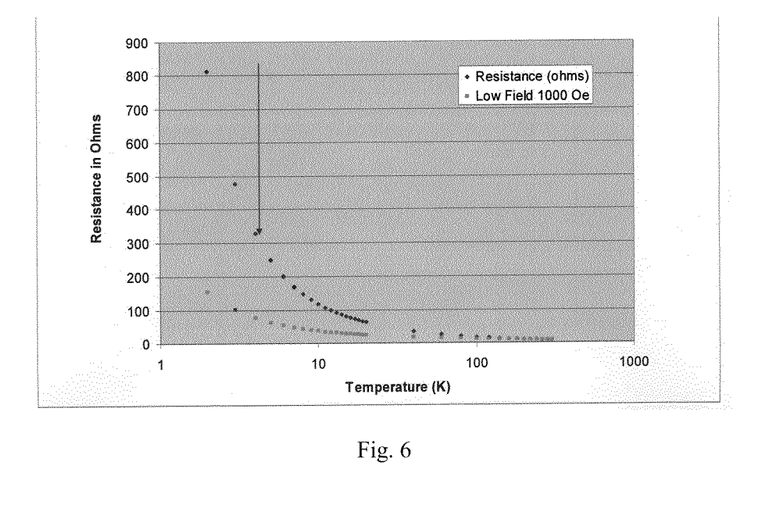
FIG. 6 illustrates resistivity versus temperature characteristics of carbon nanotubes in (and out of) the presence of a magnetic field.

Carbon nanotubes of the present invention can exhibit certain characteristics which are shown in FIGS. 2-6. FIG. 2 shows the break even frequencies for conductors made of a carbon nanotube wire, a copper wire, and a Litz wire. Resistance is influenced by several factors, including skin effect, proximity effect, and conductor shape. Moreover, resistance is also influenced by DC behavior where copper is approximately sixty times stronger. FIG. 3 shows the same calculations as FIG. 2 using much thicker carbon nanotube wires. The break even frequencies for the thicker carbon nanotube wires are lower. FIG. 4 illustrates the electrical properties of carbon nanotubes made in accordance with one embodiment of the present invention. FIG. 5 illustrates the resistivity of these carbon nanotubes in relation to temperature. FIG. 6 illustrates characteristics of carbon nanotube resistivity versus temperature in (and out of) the presence of a magnetic field.

It should be noted that although reference is made throughout the application to nanotubes synthesized from carbon, other compound(s), such as boron, $MoS_2$, or a combination thereof may be used in the synthesis of nanotubes in connection with the present invention. For instance, it should be understood that boron nanotubes may also be grown, but with different chemical precursors. In addition, it should be noted that boron may also be used to reduce resistivity in individual carbon nanotubes. Furthermore, other methods, such as plasma CVD or the like can also be used to fabricate the nanotubes of the present invention.

Cable Formation

To carry relatively high current pulses between two conductors, such as a high energy capacitor, a ground strap, a bus bar or bus pipe, or pulse generating circuit, to an external circuit without degradation of the waveform or without heating of a junction, the present invention provides, in an embodiment, a conductive cable, such as that shown in FIG. 1. The conductive cable may be, in an embodiment, a coaxial cable 40. The coaxial cable 40 may include, among other things, a conducting member 42 made from a nanostructure-based material and a shielding layer 44 circumferentially situated about the conducting member 42 and made from a material capable of providing substantially low resistance coupling, such as, sheet 26. It should be noted that this coaxial cable 40 arrangement is being provided only for illustrative purposes and other configurations may be possible.

In accordance with one embodiment, the coaxial cable 40 may include a conducting member 42 made from a nanostructure-based material. The nanostructure-based material, in an embodiment, may be defined by yarns, ribbons, wires, cables, tapes or sheets made in accordance with the present invention from carbon nanotubes fabricated in a manner similar to that disclosed in U.S. patent application Ser. No. 11/488,387 to Lashmore et al. (which application is hereby incorporated in its entirety by reference). For tapes and sheets, they may be rolled into a cylindrical shape to form the conducting member 42.

Formation of Conducting Member

Figure 7:
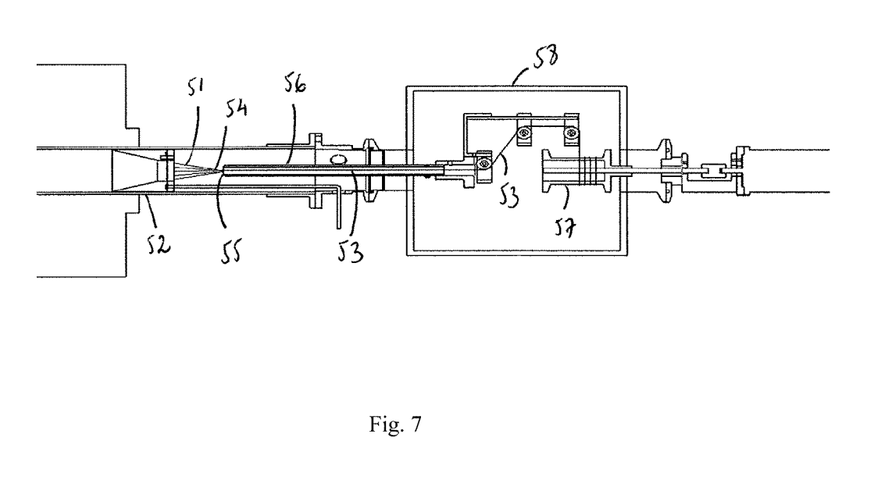
FIG. 7 illustrates a system for formation and harvesting of nanofibrous materials in accordance with one embodiment of the present invention.

With reference now to FIG. 7, under steady-state production using a CVD process of the present invention, nanotubes 51 may be collected from within a synthesis chamber 52 and a yarn 53 may thereafter be formed. Specifically, as the nanotubes 51 emerge from the synthesis chamber 52, they may be collected into a bundle 54, fed into intake end 55 of a spindle 56, and subsequently spun or twisted into yarn 53 therewithin. It should be noted that a continual twist to the yarn 53 can build up sufficient angular stress to cause rotation near a point where new nanotubes 51 arrive at the spindle 56 to further the yarn formation process. Moreover, a continual tension may be applied to the yarn 53 or its advancement into collection chamber 58 may be permitted at a controlled rate, so as to allow its uptake circumferentially about a spool 57.

Typically, the formation of the yarn results from a bundling of nanotubes that may subsequently be tightly spun into a twisting yarn. Alternatively, a main twist of the yarn may be anchored at some point within system 10 and the collected nanotubes may be wound on to the twisting yarn. Both of these growth modes can be implemented in connection with the present invention.

The conducting member 42 may be made from one of carbon, copper, silver, boron-nitride, boron, $MoS_2$, or a combination thereof. Moreover, the material from which the conducting member 42 may be made can include, in an embodiment, graphite of any type, for example, such as that from pyrograph fibers. The conducting member 42 may be designed to transmit electrical signals such as AC, DC, low power, or high power. In an embodiment, the conducting member 42 may range from about 1 to about 3 percent by weight of the entire structure. Of course, this range is only for illustrative purposes, and a smaller or larger range can be employed.

Figure 18A:
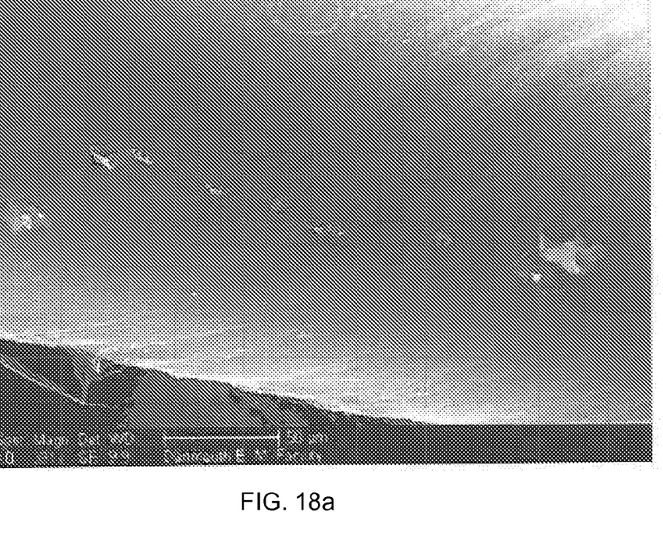
FIG. 18a illustrates an example of a carbon nanotube yarn.
Figure 18B:
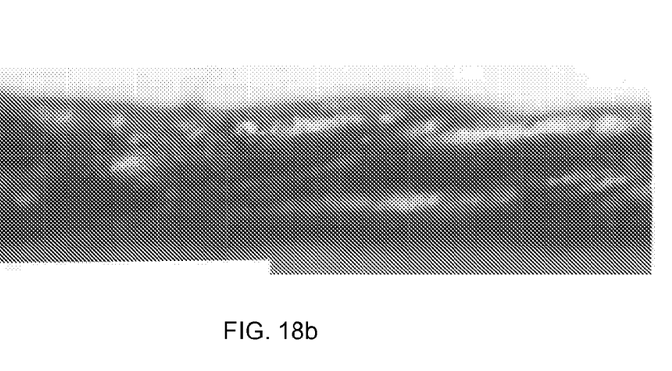
FIG. 18b illustrates an example of a plied nanotube yarn.
Figure 19:
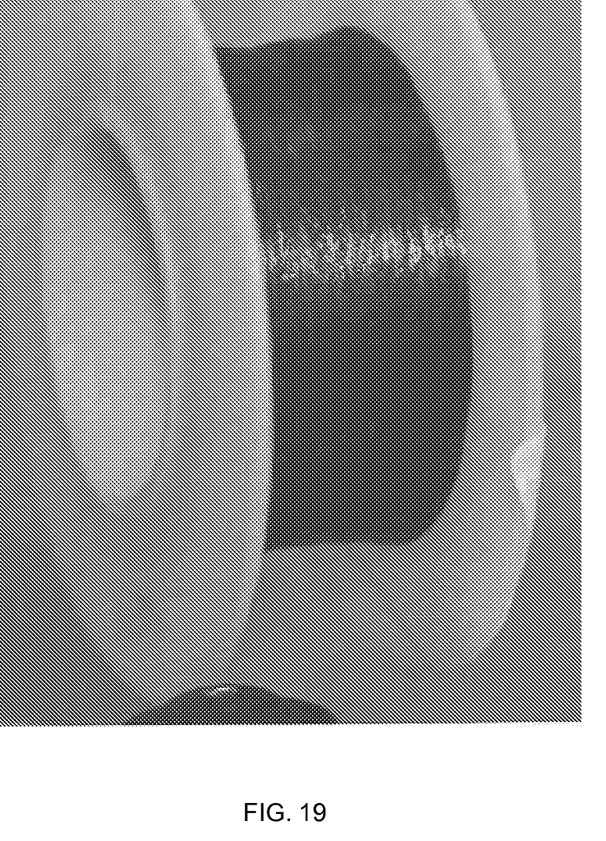
FIG. 19 illustrates an example of carbon nanotube yarns coiled on a spool.

FIG. 18a shows an example of a carbon nanotube yarns, such as yarn 53 for example. FIG. 18b shows an example of a plied carbon nanotube yarn which may be used as a conductor. FIG. 20 shows an example of a carbon nanotube yarn, such as yarn 53, coiled on a spool.

Fabricating Sheets

Figure 9:
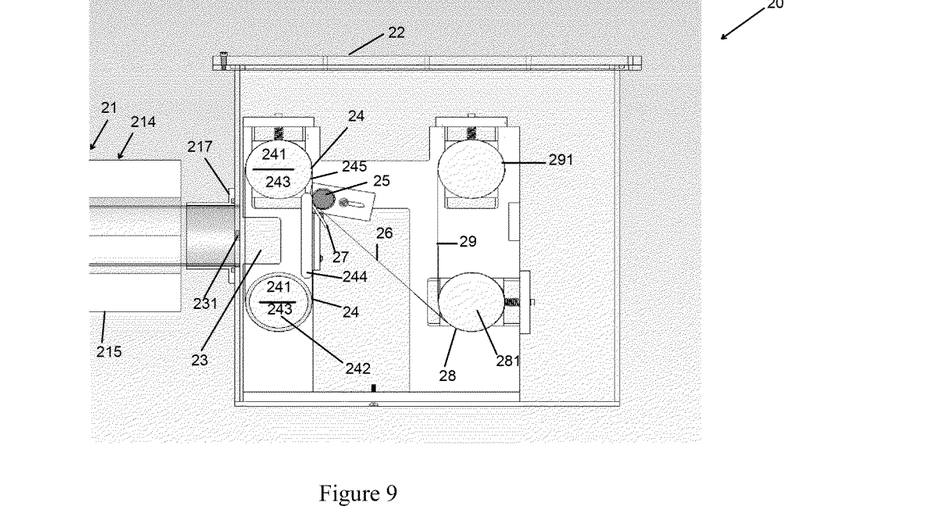
FIG. 9 illustrates another variation of the system of the present invention for formation and harvesting of nanofibrous materials.

With reference now to FIG. 9, there is illustrated a system 10, similar to that disclosed in U.S. patent application Ser. No. 11/488,387 (incorporated herein by reference), for use in the fabrication of nanotubes. System 10, in an embodiment, may be coupled to a synthesis chamber 11. The synthesis chamber 11, in general, includes an entrance end 111, into which reaction gases (i.e., gaseous carbon source) may be supplied, a hot zone 112, where synthesis of extended length nanotubes 113 may occur, and an exit end 114 from which the products of the reaction, namely the nanotubes and exhaust gases, may exit and be collected. The synthesis chamber 11, in an embodiment, may include a quartz tube 115 extending through a furnace 116. The nanotubes generated by system 10, on the other hand, may be individual single-walled nanotubes, bundles of such nanotubes, and/or intertwined single-walled nanotubes (e.g., ropes of nanotubes).

System 10, in one embodiment of the present invention, may also include a housing 12 designed to be substantially airtight, so as to minimize the release of potentially hazardous airborne particulates from within the synthesis chamber 11 into the environment. The housing 12 may also act to prevent oxygen from entering into the system 10 and reaching the synthesis chamber 11. In particular, the presence of oxygen within the synthesis chamber 11 can affect the integrity and compromise the production of the nanotubes 113.

System 10 may also include a moving belt 120, positioned within housing 12, designed for collecting synthesized nanotubes 113 made from a CVD process within synthesis chamber 11 of system 10. In particular, belt 120 may be used to permit nanotubes collected thereon to subsequently form a substantially continuous extensible structure 121, for instance, a non-woven or woven sheet. Such a sheet 26 may be generated from compacted, substantially non-aligned, and intermingled nanotubes 113, bundles of nanotubes, or intertwined nanotubes (e.g., ropes of nanotubes), with sufficient structural integrity to be handled as a sheet 26.

Figure 8:
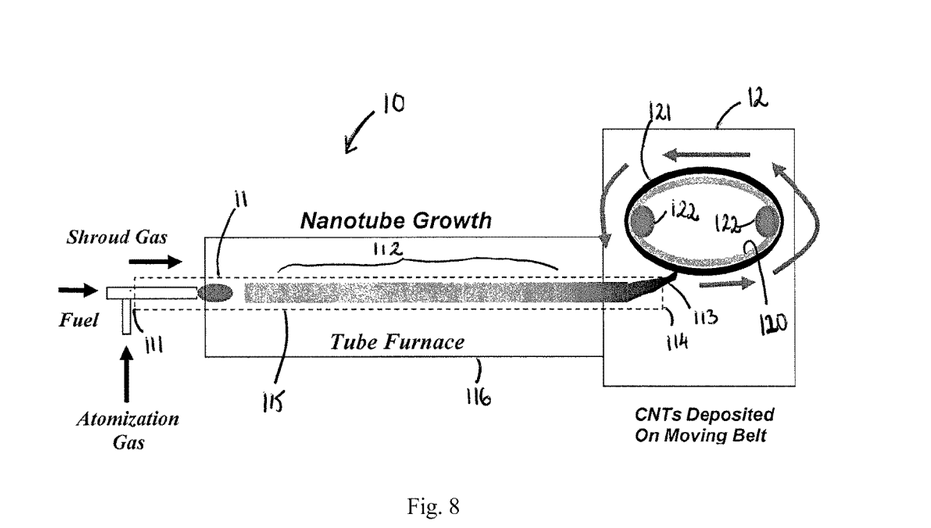
FIG. 8 illustrates a Chemical Vapor Deposition system for fabricating nanotubes, in accordance with one embodiment of the present invention.

To collect the fabricated nanotubes 113, belt 120 may be positioned adjacent the exit end 114 of the synthesis chamber 11 to permit the nanotubes to be deposited on to belt 120. In one embodiment, belt 120 may be positioned substantially parallel to the flow of gas from the exit end 114, as illustrated in FIG. 8. Alternatively, belt 120 may be positioned substantially perpendicular to the flow of gas from the exit end 114 and may be porous in nature to allow the flow of gas carrying the nanomaterials to pass therethrough. Belt 120 may be designed as a continuous loop, similar to a conventional conveyor belt. To that end, belt 120, in an embodiment, may be looped about opposing rotating elements 122 (e.g., rollers) and may be driven by a mechanical device, such as an electric motor. Alternatively, belt 120 may be a rigid cylinder. In one embodiment, the motor may be controlled through the use of a control system, such as a computer or microprocessor, so that tension and velocity can be optimized.

Looking at FIG. 9, system 20 may include a pressure applicator, such as roller 25, situated adjacent belt 24 to apply a compacting force (i.e., pressure) onto the collected nanomaterials. In particular, as the nanomaterials get transported toward roller 25, the nanomaterials on belt 24 may be forced to move under and against roller 25, such that a pressure may be applied to the intermingled nanomaterials while the nanomaterials get compacted between belt 24 and roller 25 into a coherent substantially-bonded sheet 26. To enhance the pressure against the nanomaterials on belt 24, a plate 244 may be positioned behind belt 24 to provide a hard surface against which pressure from roller 25 can be applied. It should be noted that the use of roller 25 may not be necessary should the collected nanomaterials be ample in amount and sufficiently intermingled, such that an adequate number of contact sites exists to provide the necessary bonding strength to generate the sheet 26.

To disengage the sheet 26 of intermingled nanomaterials from belt 24 for subsequent removal from housing 22, a scalpel or blade 27 may be provided downstream of the roller 25 with its edge against surface 245 of belt 24. In this manner, as sheet 26 moves downstream past roller 25, blade 27 may act to lift the sheet 26 from surface 245 of belt 24.

Additionally, a spool or roller 28 may be provided downstream of blade 27, so that the disengaged sheet 26 may subsequently be directed thereonto and wound about roller 28 for harvesting. As the sheet 26 is wound about roller 28, a plurality of layers may be formed. Of course, other mechanisms may be used, so long as the sheet 26 can be collected for removal from the housing 22 thereafter. Roller 28, like belt 24, may be driven, in an embodiment, by a mechanical drive, such as an electric motor 281, so that its axis of rotation may be substantially transverse to the direction of movement of the sheet 26. In an alternate embodiment, a blade does not have to be in use to remove the sheet 26. Rather, removal of the sheet 26 may be by hand or by other known methods in the art.

Figure 10:
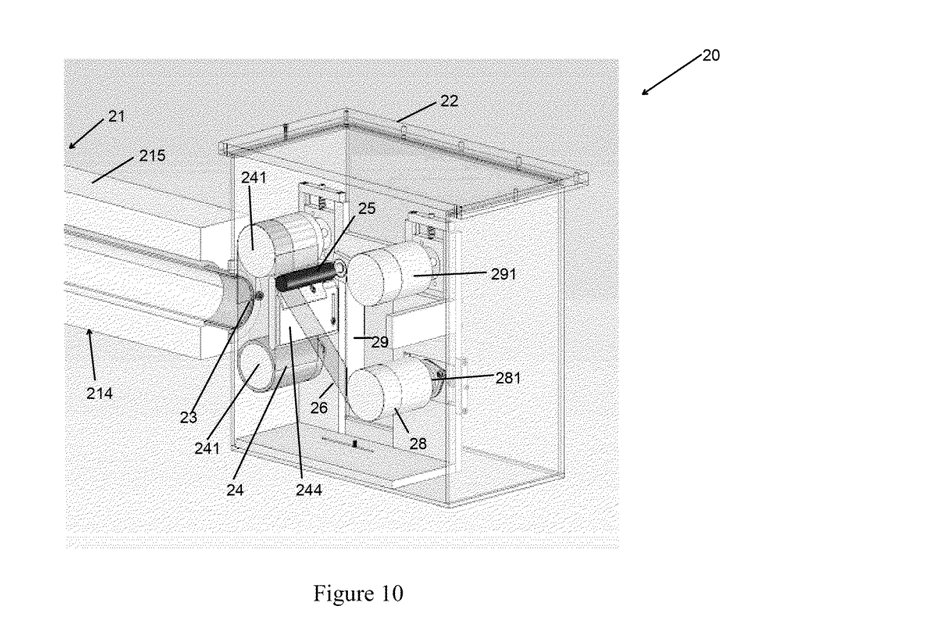
FIG. 10 illustrates a system of the present invention for formation and harvesting of nanofibrous materials.

In order to minimize bonding of the sheet 26 to itself as it is being wound about roller 28, a separation material 29 (see FIG. 10) may be applied onto one side of the sheet 26 prior to the sheet 26 being wound about roller 28. The separation material 29 for use in connection with the present invention may be one of various commercially available metal sheets or polymers that can be supplied in a continuous roll 291. To that end, the separation material 29 may be pulled along with the sheet 26 onto roller 28 as sheet 26 is being wound about roller 28. It should be noted that the polymer comprising the separation material 29 may be provided in a sheet, liquid, or any other form, so long as it can be applied to one side of sheet 26. Moreover, since the intermingled nanotubes within the sheet 26 may contain catalytic nanoparticles of a ferromagnetic material, such as Fe, Co, Ni, etc., the separation material 29, in one embodiment, may be a non-magnetic material, e.g., conducting or otherwise, so as to prevent the sheet 26 from sticking strongly to the separation material 29. In an alternate embodiment, a separation material may not be necessary.

Once a sheet 26 is generated, the sheet 26 may undergo treatment to increase conductivity and productivity. Treatment of a sheet 26 after formation may, in an embodiment, include subjecting the sheet 26 to a protonation agent. One feature of the protonation agent may be to bring the carbon nanotubes in closer proximity with one another. By bringing the carbon nanotubes closer together, the protonation agent may act to reduce surface tension, reduce resistivity, and increase conductivity of the sheet 26. Examples of a protonation agent may include an acid such as hydronium ion, hydrochloric acid, hydrobromic acid, hydrofluoric acid, hydroiodic acid, carbonic acid, sulfuric acid, nitric acid, fluorosulfuric acid, chlorosulfonic acid, methane sulfonic acid, trifluoromethane sulfonic acid, oleum, an agent thereof, or a combination thereof, or other materials capable of being electrically and/or thermally conductive.

In an alternate embodiment, treatment of the sheet 26 may further include spraying the sheet 26 with a solution as it exits the furnace and is collected on the belt. The solution may contain compounds that cover the outer surface of the nanotubes in such a manner as to enhance alignment of the carbon nanotubes and allow the carbon nanotubes to come into closer proximity with one another. In an embodiment, the solution may include a solvent, a polymer, a metal, or a combination thereof. Examples of a solvent that can be used in connection with the solution include toluene, kerosene, benzene, hexanes, acetone or any other solvent. Examples of a polymer that can be used in connection with the solution include polyurethane, polyethylene, poly(styrene butadiene), polychloroprene, poly(vinyl alcohol), poly(vinyl pyrrolidone), poly(acrylonitrile-co-butadiene-co-styrene), epoxy, or any polymer. Examples of a metal that can be used in connection with the solution include a salt, metal oxide, or any other metal.

Once the sheet 26 has been treated, the treated sheet 26 may be subject to a heat source for processing of the sheet 26. For example, the sheet 26 may be subject to sintering, hot isostatic pressing, hot pressing, cold isostatic pressing so as to yield a composite sheet or the desired form of the final product.

Treatment of the composite sheet may, in another embodiment, further include infusing the composite sheet with a glassy carbon material so as to increase the structural integrity of the sheet and provide substantially low resistance coupling. Glassy carbon, in general, may be a form of carbon related to carbon nanotubes and can contain a significant amount of graphene like ribbons comprising a matrix of amorphous carbon. These ribbons include $sp^2$ bonded ribbons that can be substantially similar to the $sp^2$ bonded nanotubes. As a result, they can have relatively good thermal and electrical conductivity. Examples of precursor materials from which glassy carbon can be made include furfuryl alcohol, RESOL resin (i.e., catalyzed alkyl-phenyl formaldehyde), PVA, or liquid resin or any material known to form glassy carbon when heat treated. Of course, other commercially available glassy carbon materials or precursor materials can be used.

After the composite sheet is generated, it may be left as a composite sheet or it may be cut into smaller segments, such as strips. In an embodiment, a laser may be used to cut the composite sheet into strips. The laser beam may, in an embodiment, be situated adjacent the housing such that the laser may be directed at the composite sheet as it exits the housing. A computer or program may be employed to control the operation of the laser beam and also the cutting of the strip. In an alternative embodiment, any mechanical means or other means known in the art may be used to cut the composite sheet 26 into strips.

Formation of Cable

To form the cable of the present invention, the conducting member 42 may be provided with a shielding layer 44. In shielding layer 44, in an embodiment, may be made from a nanostructure-based material. The nanostructure-based material, in one embodiment, can be those made from conductive carbon nanotube, for instance, yarns, tapes, cables, ribbons, or sheets made from carbon nanotubes. The shielding layer, on the other hand, may be made from sheets made from carbon nanotubes so long as the material can be electrically and/or thermally conductive. In an embodiment, the shielding layer 44 may range from about 4 to about 7 percent by weight of the entire structure. Of course, this range is only for illustrative purposes, and a smaller or larger range can be employed. The shielding layer 44, in an embodiment, when coupled to conducting member 42, can permit high current from a source to be directed along the conducting member 42 to an external circuit without substantial degradation. This is because nanotubes defining the shielding layer 44 of the present invention can act to minimize RF signals or other electromagnetic waves or signals from being leaked to or from the conducting member 42. Of course, any other material available commercially that can act to minimize RF signals or other electromagnetic waves or signals from being leaked to or from the conducting member 42 may be used in place of shielding layer 44.

To the extent desired, the coaxial cable 40 can also include insulation to improve conductivity and reduce resistivity of the coaxial cable 40. In an embodiment, the coaxial cable 40 may include at least one insulation layer 46 circumferentially situated between the conducting member 42 and shielding layer 44. Insulation layer 46 may be made from a strip of carbon nanotubes, which had been cut from a sheet 26, and may range from about 33 to about 37 percent by weight of the entire structure. In one embodiment, the coaxial cable 40 may further include a second insulation layer 48 circumferentially situated about the shielding layer 44. The second insulation layer 48 may be made from a strip of carbon nanotubes, which had been cut from a sheet 26, and may range from about 55 to about 60 percent by weight of the entire structure. Of course, these ranges are only for illustrative purposes, and a smaller or larger range can be employed. In addition, any other insulative material available commercially may be used in place of insulation layers 46, 48.

Figure 17:
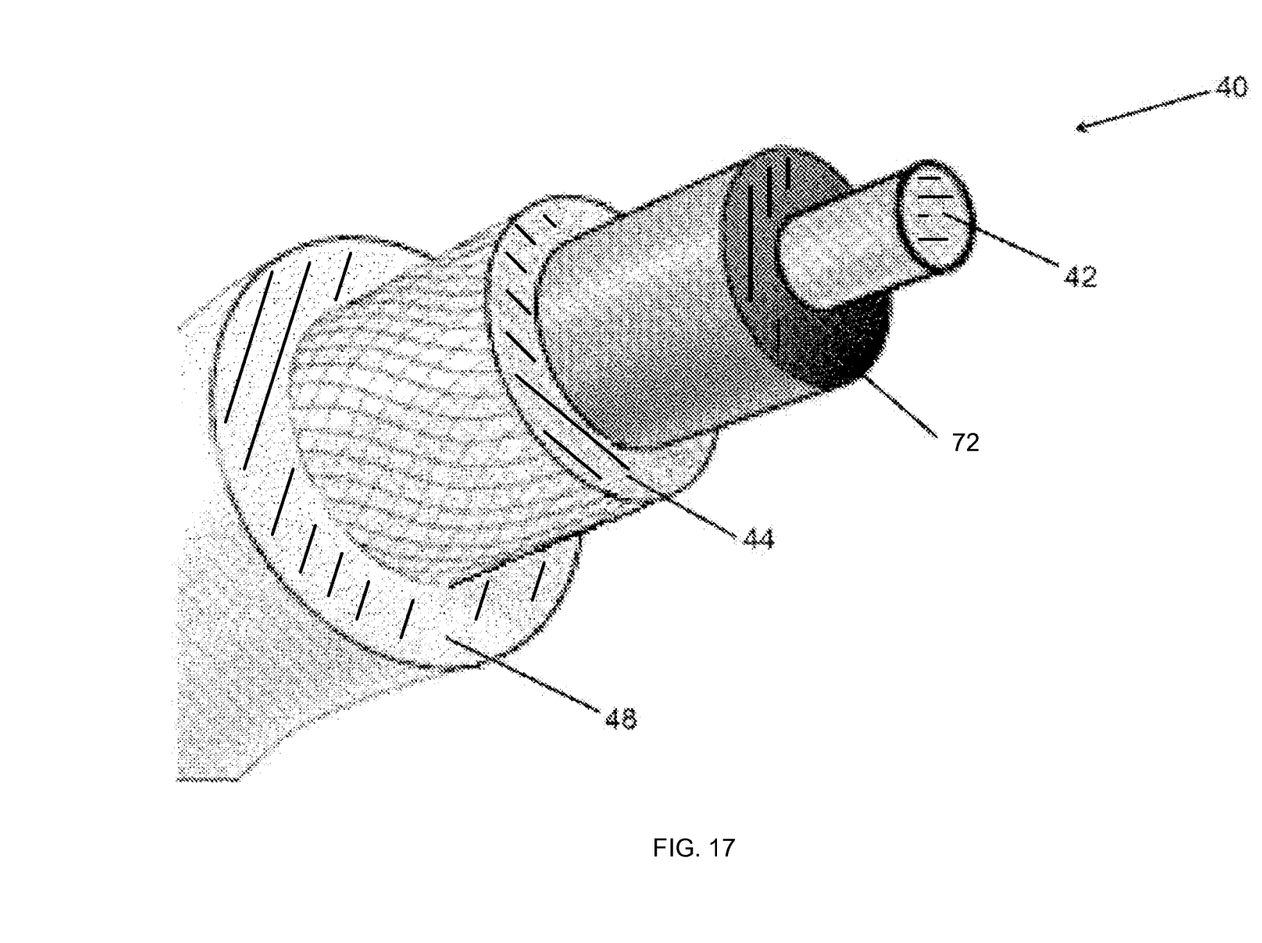
FIG. 17 illustrates a cable in accordance with another embodiment of the invention.

Referring also to FIG. 17, coaxial cable 40 may further include coupling mechanism 72 situated between the conducting member 42 and the shielding layer 44, so as to secure the shielding layer 44 in its position about the conducting member 42. In one embodiment, the coupling mechanism may be made from a glassy carbon material capable of providing substantially low resistance coupling. Glassy carbon, in general, may be a form of carbon related to carbon nanotubes and can contain a significant amount of graphene like ribbons comprising a matrix of amorphous carbon. These ribbons include sp.sup.2 bonded ribbons that can be substantially similar to the sp.sup.2 bonded nanotubes. As a result, they can have relatively good thermal and electrical conductivity. Examples of precursor materials from which glassy carbon can be made include furfuryl alcohol, RESOL resin (i.e., catalyzed alkyl-phenyl formaldehyde), PVA, or liquid resin or any material known to form glassy carbon when heat treated. It should be appreciated that the tendency of the glassy carbon resin or material to "wet" the nanotubes in the conducting member can help to coat each individual nanotube, so that each nanotube can contribute to electron or thermal transport. Of course, other commercially available glassy carbon materials or precursor materials can be used. The presence of a coupling mechanism, in an embodiment, can enhance transmission of current along the conducting member 42 without substantial degradation.

The conducting member 42 and shielding layer 44 may thereafter be held against one another, while the junction between the conducting member 42 and the shielding layer 44 may be heated to a temperature range sufficient to pyrolyze the glassy carbon precursor to form a glassy carbon material to allow for adhesion and minimizes delamination between the conducting member 42 and the shielding layer 44. The glassy carbon material may further enhance electrical or thermal conductivity between the conducting member 42 and the shielding layer 44, provide a substantially uniform contact between the conducting member 42 and the shielding layer 44, and provide substantially low resistance coupling of the conducting member 42 to the shielding layer 44. In one embodiment, the minimum temperature of pyrolysis should be at least in the neighborhood of about 400° C. to about 450° C. If pyrolysis is carried out in an inert atmosphere, the temperature may need to be higher to permit the pyrolysis process to go to completion. It should be appreciated that materials that may be sensitive to this temperature may not be suitable for this invention. Moreover, pyrolysis need not go to completion for this junction to offer substantially superior contact resistance to the traditional means for coupling conducting members.

In addition, the coupling mechanism can act to substantially maximize the number of conductive nanostructures within the conducting member 42 that can be actively involved in conductivity to enhance efficiency of electrical and thermal transport by enhancing the number of contact points between adjacent nanotubes.

The coaxial cable 40 of the present invention, thus, can be used to enable efficient conduction to a standard connector for use in a traditional electrical and/or thermal circuit systems. In particular, coaxial cable 40 can enable efficient interaction, for instance, through electrical and/or thermal conduction, between a nanoscale environment and the traditional electrical and/or thermal circuit system.

Figure 11:
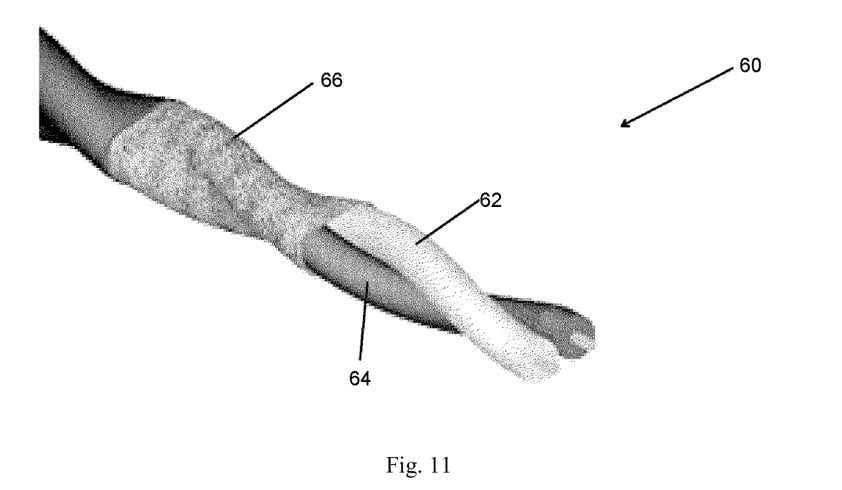
FIG. 11 illustrates a cable in accordance with another embodiment of the present invention.

FIG. 11 illustrates another embodiment of conductive cable 60 of the present invention. As shown, cable 60 may be a twisted pair cable 60. Cable 60, in an embodiment, may include a first cable 62 and a second cable 64 wrapped about one another. A nanostructured sheet, such as that provided above, may be situated circumferentially about the twisted pair cable 60. Of course, the number of cables used to create the twisted pair cable 60 may vary. For instance, three or four cables may be used.

Figure 12:
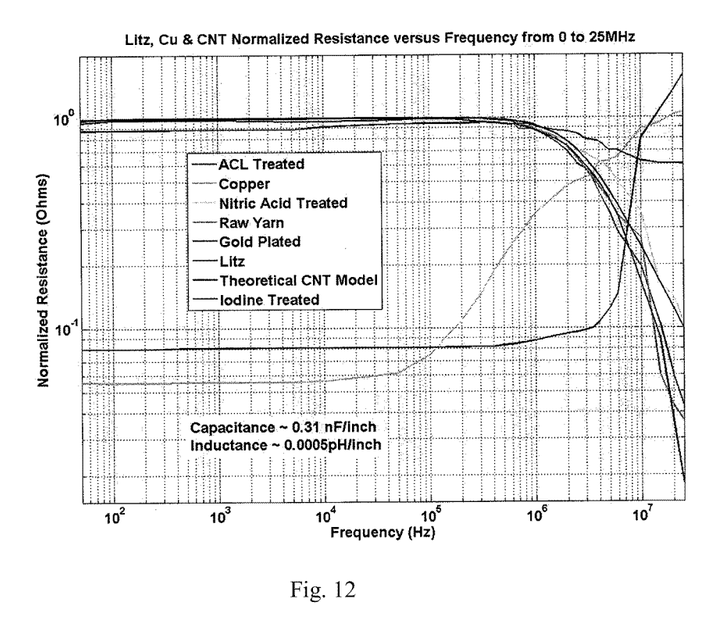
FIG. 12 illustrates resistance properties for a cable of the present invention is compared to those properties exhibited by copper wires or Litz wires.

For comparison purposes, the resistance properties for a cable of the present invention is compared to those properties exhibited by copper wires or Litz wires. As illustrated in FIG. 12, the resistances per unit length decrease substantially for a cable of the present invention at fairly moderate frequencies of about 1 MHz.

Figure 13:
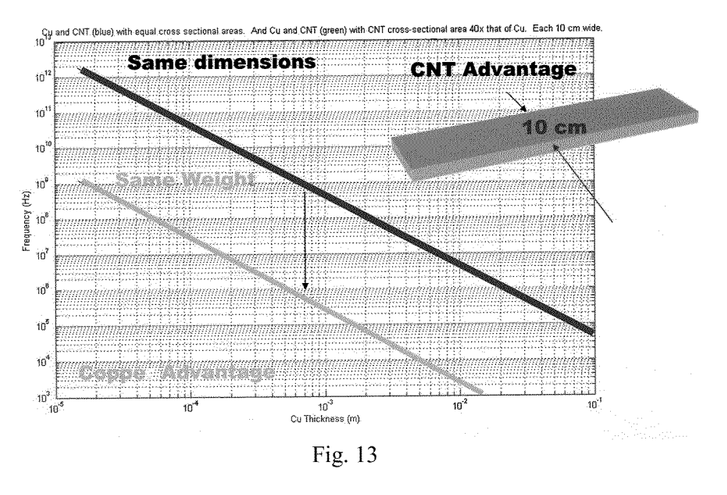
FIG. 13 illustrates the relationship between frequency of a cable of the present invention and thickness of the cable.

It should be noted that the frequency of a cable of the present invention can be dependent, in part, on the thickness of the cable. For flat ribbon conducting cables, for instance, as thickness of the cable increases, frequency decreases as illustrated in FIG. 13.

Figure 14:
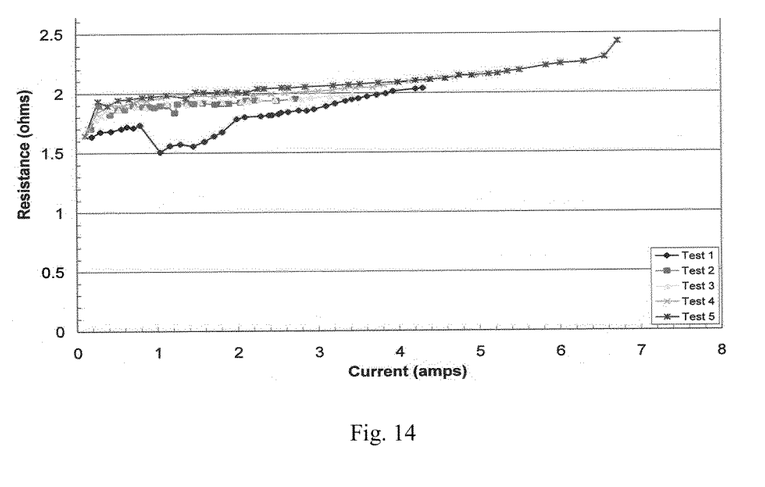
FIG. 14 illustrates resistance versus current properties for a cable made in accordance with an embodiment of the present invention as compared to those properties exhibited by copper wires or Litz wires

For illustrative purposes, the resistance versus current properties for a cable made in accordance with an embodiment of the present invention as compared to those properties exhibited by copper wires or Litz wires as shown in FIG. 14.

Figure 15:
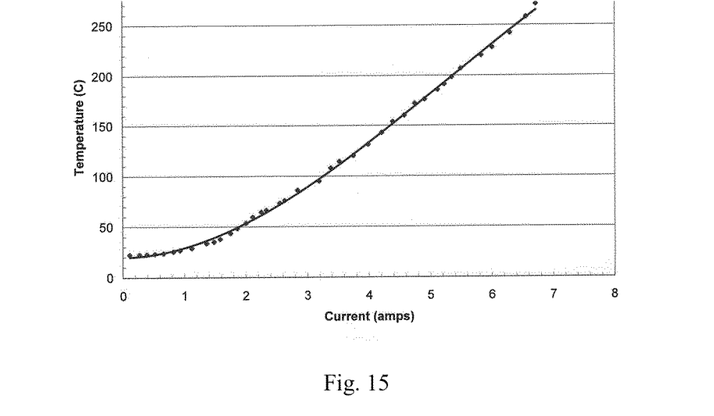
FIG. 15 illustrates current versus temperature properties for a cable of the present invention.

Moreover, the current versus temperature properties for a cable of the present invention is illustrated in FIG. 15.

Applications

A cable of the present invention may be provided in various arrangements. Because of lightness of carbon nanotubes made in accordance with the present invention, a cable made in accordance with the present invention can provide significant weight savings up to about fifty percent as compared with conventional cables. For example, as shown in FIG. 1, a cable may take the form of a coaxial cable 40. The weight savings for a coaxial cable compared to a regular cable is about 9.4 lbs/1000 ft of cable, which is about a 40.8% savings. As shown in FIG. 11, a cable may take the form of a twisted pair cable 50. The weight savings for a twisted pair cable 50 is about 7.9 lbs/1000 ft of cable, which is about a 37.3% savings. Alternatively, the cable may take the form of a flat ribbon. It should be appreciated that these arrangements are not intended to be limiting as other arrangements may exist.

Figure 16:
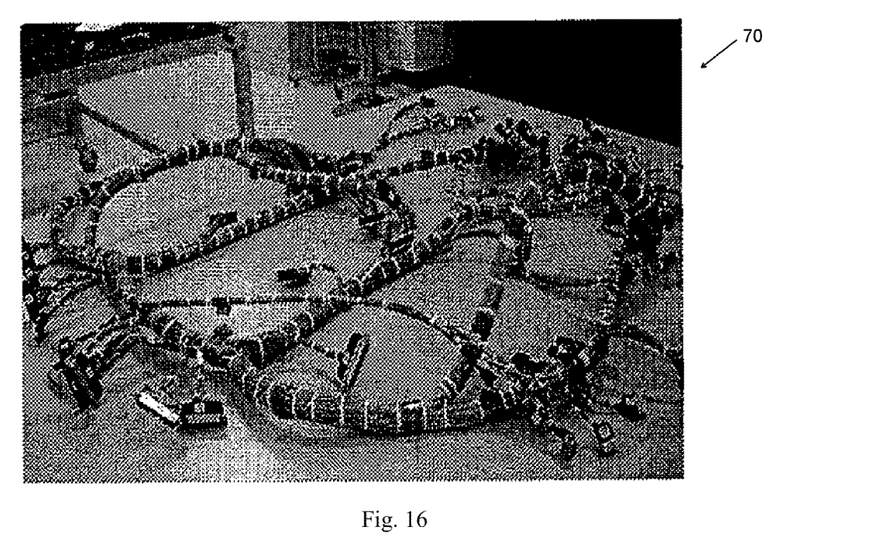
FIG. 16 illustrates another embodiment of the present invention in which the cable is part of a wiring harness.

The cables of the present invention, in an embodiment, may be arranged as a wiring harness 70, as shown in FIG. 16.

Wiring harnesses 70 may vary in shape, size and configuration. Wiring harnesses 70 can result in significant weight savings which can result in cost savings. The weight savings for a satellite, for instance, due to the use of the wiring harness 70 will contribute to significant cost savings per launch when using a wiring harness such as that of the present application. The weight savings for a civilian or combat airplane, similarly, would result in weight and cost savings per flight due to the use of the wiring harness.

While the present invention has been described with reference to certain embodiments thereof, it should be understood by those skilled in the art that various changes may be made and equivalents may be substituted without departing from the true spirit and scope of the invention. In addition, many modifications may be made to adapt to a particular situation, indication, material and composition of matter, process step or steps, without departing from the spirit and scope of the present invention. All such modifications are intended to be within the scope of the claims appended hereto.

What is claimed is:

1. A method for making a cable, the method comprising:
   providing a conducting member defined by one or more yarns extending an entire length of the cable and defined by a plurality of nanotubes continuously intertwined along the entire length of the one or more yarns;
   placing a shielding layer circumferentially about the conducting member;
   applying a coupling mechanism made from a glassy carbon material between the shielding layer and the conducting member so as to secure the shielding layer in its position about the conducting member; and
   heating a material junction between the shielding layer and the conducting member to pyrolyze a glassy carbon precursor to form the glassy carbon material to allow for adhesion and minimize delamination between the shielding layer and the conducting member.

2. A method as set forth in claim 1, wherein, in the step of providing, includes bonding a plurality of yarns made from the plurality of intertwined nanotubes to create the conducting member.

3. A method as set forth in claim 1, further including placing a first insulation layer circumferentially about the conducting member.

4. A method as set forth in claim 1, further including placing an insulation layer circumferentially about the shielding layer.

5. A method as set forth in claim 1, wherein applying the coupling mechanism includes utilizing glassy carbon material.

6. A method as set forth in claim 1, wherein the step of placing includes forming the glassy carbon material from a glassy carbon precursor including one of furfuryl alcohol, RESOL resin, PVA, or other liquid resin or material capable of forming the glassy carbon material.

7. A method as set forth in claim 1, wherein the step of heating includes raising the temperature at the junction to a range of from about 400° C. to about 450° C. or higher to permit the pyrolysis process to go to completion.

\* \* \* \* \*